(12) United States Patent  
Jobetto

(10) Patent No.: US 7,279,750 B2  
(45) Date of Patent: Oct. 9, 2007

(54) SEMICONDUCTOR DEVICE INCORPORATING A SEMICONDUCTOR CONSTRUCTING BODY AND AN INTERCONNECTING LAYER WHICH IS CONNECTED TO A GROUND LAYER VIA A VERTICAL CONDUCTING PORTION

(75) Inventor: Hiroyasu Jobetto, Hachioji (JP)

(73) Assignees: Casio Computer Co., Ltd., Tokyo (JP); CMK Corporation, Tokyo (JP)

( * ) Notice: Subject to any disclaimer, the term of this patent is extended or adjusted under 35 U.S.C. 154(b) by 0 days.

(21) Appl. No.: 11/093,570

(22) Filed: Mar. 30, 2005

(65) Prior Publication Data

US 2005/0218451 A1    Oct. 6, 2005

(30) Foreign Application Priority Data

Mar. 31, 2004    (JP) .............................. 2004-107799

(51) Int. Cl.  
    *H01L 27/01*    (2006.01)
(52) U.S. Cl. ..................... 257/347; 257/686; 257/738; 257/774; 257/E21.585
(58) Field of Classification Search ............... 257/688, 257/693, 698, 737, 738, 773, 774, 347, 686, 257/E21.585  
See application file for complete search history.

(56) References Cited

U.S. PATENT DOCUMENTS

| | | | |
|---|---|---|---|
| 6,486,005 B1 | 11/2002 | Kim | |
| 2001/0010627 A1* | 8/2001 | Akagawa | ..................... 361/761 |
| 2004/0245614 A1* | 12/2004 | Jobetto | ....................... 257/678 |
| 2005/0140007 A1* | 6/2005 | Jobetto | ....................... 257/738 |
| 2005/0140021 A1 | 6/2005 | Wakisaka et al. | |
| 2005/0161799 A1* | 7/2005 | Jobetto | ....................... 257/690 |

FOREIGN PATENT DOCUMENTS

| | | |
|---|---|---|
| JP | 2001-168128 A | 6/2001 |
| JP | 2004-71998 A | 3/2004 |

\* cited by examiner

*Primary Examiner*—Andy Huynh  
(74) *Attorney, Agent, or Firm*—Frishauf, Holtz, Goodman & Chick, P.C.

(57) ABSTRACT

A semiconductor device includes metal foil to which a ground potential is applied, at a semiconductor constructing body provided on the metal foil and having a semiconductor substrate and a plurality of external connection electrodes provided on the semiconductor substrate. An insulating layer is provided around the semiconductor constructing body and has a thickness substantially equal to the semiconductor constructing body. An one upper interconnecting layer is provided on the semiconductor constructing body and insulating layer, and electrically connected to the external connection electrodes. A vertical conducting portion extends through the insulating layer and electrically connects the metal foil and upper interconnecting layer.

8 Claims, 24 Drawing Sheets

SEMICONDUCTOR DEVICE INCORPORATING A SEMICONDUCTOR CONSTRUCTING BODY AND AN INTERCONNECTING LAYER WHICH IS CONNECTED TO A GROUND LAYER VIA A VERTICAL CONDUCTING PORTION

CROSS-REFERENCE TO RELATED APPLICATIONS

This application is based upon and claims the benefit of priority from prior Japanese Patent Application No. 2004-107799, filed Mar. 31, 2004, the entire contents of which are incorporated herein by reference.

BACKGROUND OF THE INVENTION

1. Field of the Invention

The present invention relates to a semiconductor device incorporating a semiconductor constructing body, and a method of fabricating the same.

2. Description of the Related Art

Recently, a semiconductor device called a CSP (Chip Size Package) is developed as the downsizing of portable electronic apparatuses such as cellular phones advances. This CSP is obtained by forming a passivation film (intermediate insulating film) on the upper surface of a bare semiconductor device having a plurality of connecting pads for external connection, forming holes in those portions of the passivation film, which correspond to the connecting pads, forming interconnections to be connected to the connecting pads through these holes, forming columnar external connection electrodes on the other end portions of the interconnections, and filling a sealing material between the external connection electrodes.

Solder balls are formed on the columnar external connection electrodes of this CSP, and then the CSP can be bonded to a circuit board having connecting terminals by a face down method, so the mounting area can be made substantially the same size as the bare semiconductor device. Therefore, compared to a face up bonding method using conventional wire bonding or the like, the electronic apparatus can be greatly downsized.

A semiconductor device disclosed in Jpn. Pat. Appln. KOKAI Publication No. 2001-168128 is an example of this CSP. The semiconductor device described in this prior art reference is fabricated by a method in which a passivation film, interconnections, external connection electrodes, and sealing material are formed on a semiconductor substrate in the form of a wafer, solder balls are formed on the upper surfaces of the external connection electrodes not covered with the sealing material but exposed, and the semiconductor substrate is cut along dicing lines. Accordingly, not only the size can be decreased to a just chip size separated by dicing, but also the productivity can be increased because the number of steps can be largely reduced.

In recent years, downsizing of semiconductor devices is increasingly demanded with advancing downsizing of products such as cellular phones, and the degree of integration of semiconductor devices is more and more increasing. With this increase in integration degree of semiconductor devices, the number of external connection electrodes increases, and this poses the following problems. In the CSP as described above, the external connection electrodes are arranged on the upper surface of a bare semiconductor device, so the electrodes are generally arranged in a matrix. In a semiconductor device having a very large number of external connection electrodes, therefore, the size and pitch of the external connection electrodes extremely decrease. This makes it impossible to fabricate a CSP in which the number of external connection electrodes is large compared to the size of a bare semiconductor device. That is, if the size and pitch of external connection electrodes extremely decrease, alignment with a circuit board becomes difficult. This also poses fatal problems that, e.g., the junction strength becomes insufficient, the external connection electrodes shortcircuit during bonding, and the electrodes are destroyed by stress produced by the difference between the linear thermal expansion of the semiconductor substrate which is usually a silicon substrate and that of the circuit board.

Also, as described above, the conventional semiconductor device can be bonded to a circuit board by the face down method, so the mounting area can be made substantially the same size as the bare semiconductor device. Therefore, the electronic apparatus can be greatly downsized compared to the face up bonding method using conventional wire bonding or the like, but this downsizing is still limited.

That is, since the CSP is bonded to a circuit board by the face down method, the surface opposite to the connection pad formation surface of the bare semiconductor device is the upper surface. To connect this surface to ground of the circuit board, a dedicated connecting part is formed outside the CSP, and this limits the downsizing. Also, the wiring length increases because this connecting part is formed outside the CSP. Since this poses a problem such as an increase of the impedance (e.g., stray capacitance), the circuit characteristics deteriorate in some cases.

BRIEF SUMMARY OF THE INVENTION

It is, therefore, an object of the present invention to provide a novel semiconductor device by which the size and pitch of external connection electrodes can be set to a necessary size and pitch even if the number of these electrodes increases, an electronic apparatus can be further downsized, and deterioration of the circuit characteristics can be suppressed by minimizing the wiring length, and to provide a method of fabricating this semiconductor device.

According to an aspect of the present invention, there is provided a semiconductor device comprising metal foil to which a ground potential is applied; at least one semiconductor constructing body provided on the metal foil and having a semiconductor substrate and a plurality of external connection electrodes provided on the semiconductor substrate; an insulating layer provided around the semiconductor constructing body and having a thickness substantially equal to the semiconductor constructing body; at least one upper interconnecting layer provided on the semiconductor constructing body and insulating layer and electrically connected to the external connection electrodes of the semiconductor constructing body; and a vertical conducting portion which extends through at least the insulating layer and electrically connects the metal foil and upper interconnecting layer.

According to another aspect of the present invention, there is provided a semiconductor device fabrication method comprising:

preparing a base member having at least one conductive surface, and separately arranging, on the base member, a plurality of semiconductor constructing bodies each having a semiconductor substrate and a plurality of external connection electrodes formed on the semiconductor substrate;

forming an insulating layer on the base member around the semiconductor constructing body;

forming at least one upper interconnecting layer on the semiconductor constructing body and insulating layer, such that the upper interconnecting layer is electrically connected to the external connection electrodes of the semiconductor constructing body;

forming a vertical conducting portion which electrically connects one surface of the base member and the upper interconnecting layer through at least the insulating layer; and cutting the insulating layer and base member between the semiconductor constructing bodies, thereby obtaining a plurality of semiconductor devices each including at least one semiconductor constructing body.

In the present invention, the upper interconnections are formed on the semiconductor constructing body and on the insulating layer formed around the semiconductor constructing body. Therefore, even if the number of connecting pad portions (external connection electrodes) of the upper interconnections increases, the size and pitch of these connecting pad portions can be set to a necessary size and pitch. Also, that portion of the base member, which functions as a ground layer, and the upper interconnection for grounding are connected via the vertical conducting portion formed in a through hole which is formed in at least the insulating layer. This makes it possible to further downsize the electronic apparatus, and improve the circuit characteristics by minimizing the wiring length.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

FIRST EMBODIMENT

Figure 1:
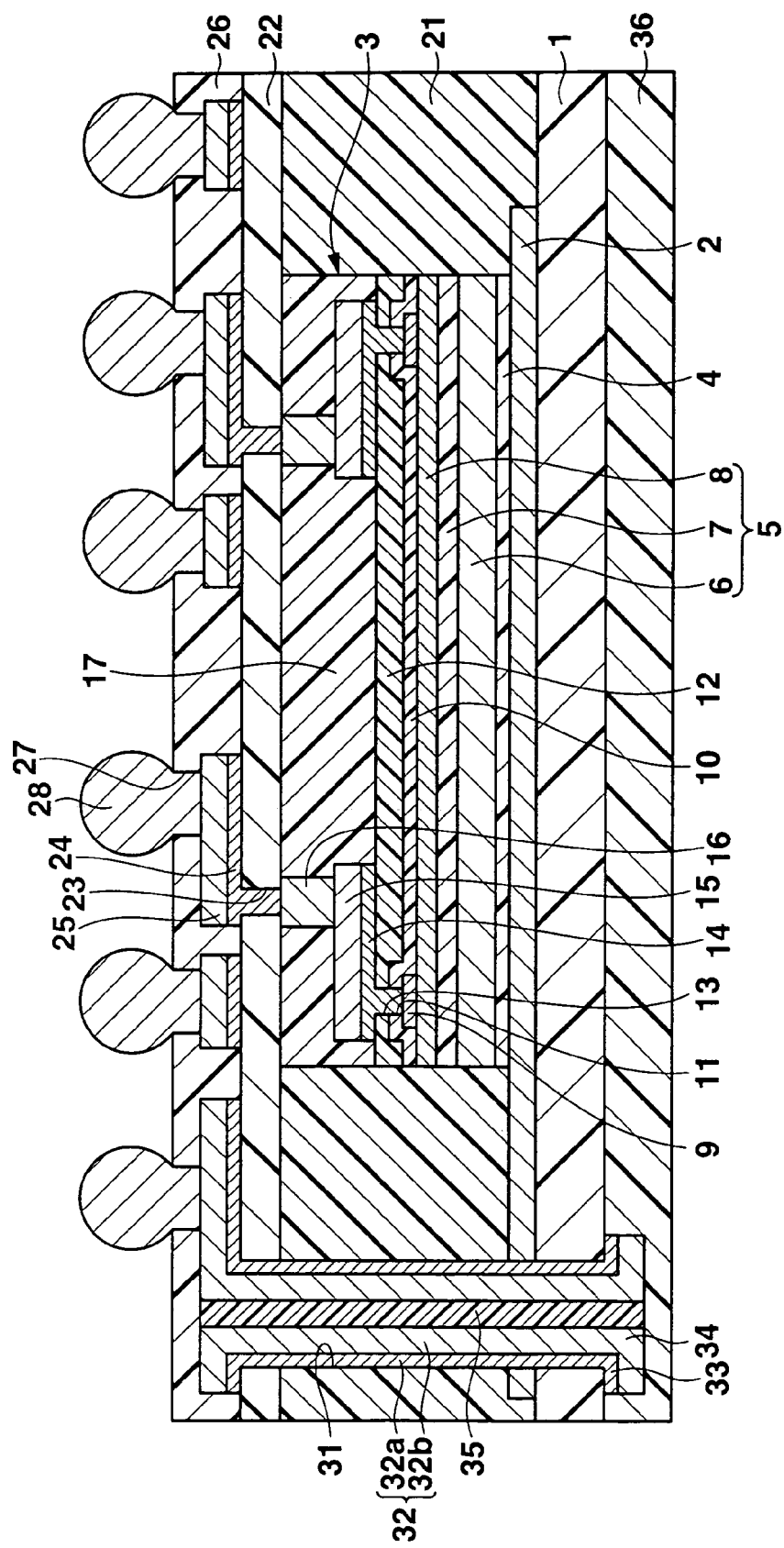
FIG. 1 is a sectional view of a semiconductor device as the first embodiment of the present invention.

FIG. 1 is a sectional view of a semiconductor device as the first embodiment of the present invention. The semiconductor device has a base plate 1 made of an insulating material such as glass-fabric-base epoxy resin, and having a rectangular planar shape. A ground layer (metal foil) 2 made of copper foil and having a solid pattern is formed on the upper surface of the base plate 1. The base plate 1 and the ground layer 2 formed on the base plate 1 form a base member having the function of a ground layer.

The lower surface of a semiconductor constructing body 3 having a rectangular planar shape of a size somewhat smaller than the size of the base plate 1 is adhered to the upper surface of the ground layer 2 via an adhesive layer 4 made of a die bonding material. The semiconductor constructing body 3 has interconnections, columnar electrodes, and a sealing film (all of which will be described later), and is generally called a CSP. The semiconductor constructing body 3 is particularly called a wafer level CSP (W-CSP) because each individual semiconductor constructing body 3 is obtained by dicing after the interconnections, columnar electrodes, and sealing film are formed on a silicon wafer as will be described later. The arrangement of the semiconductor constructing body 3 will be explained below.

The semiconductor constructing body 3 has an SOI (Silicon On Insulator) substrate 5. The SOI substrate 5 has a structure in which a silicon oxide film 7 is formed on the upper surface of a silicon (semiconductor) substrate 6, and an SOI integrated circuit portion 8 including a large number of thin-film transistors is formed on the upper surface of the silicon oxide (insulating) film 7. In this structure, the source and drain regions of the thin-film transistors of the SOI integrated circuit portion 8 are electrically connected to the silicon substrate 6 via vertical conducting portions (not shown) formed in the silicon oxide film 7.

The lower surface of the silicon substrate 6 is adhered to the upper surface of the ground layer 2 via the adhesive layer 4. The ground layer 2 which shields electrical external noise and stabilizes the electric potential is electrically connected to the lower surface of the silicon substrate 6. That is, the adhesive layer 4 may be either a conductive material made of, e.g., silver paste, or a nonconductive material made of, e.g., a die bonding material. In this embodiment, a die bonding material is used, and this die bonding material may be formed extremely thin. The silicon substrate 6 is electrically connected to the ground layer 2 via the die bonding material. In the mounted state after bonding, the ground potential is applied to the silicon substrate 6 via the ground layer 2. Since the ground potential is applied to the silicon substrate 6 of the SOI substrate 5 via the ground layer 2, the body effect of the SOI integrated circuit portion 8 can be reliably prevented. The body effect of an SOI substrate is described in Jpn. Pat. Appln. KOKAI Publication No. 2002-083975 which is incorporated herein by reference.

A plurality of connecting pads 9 made of, e.g., an aluminum-based metal are formed in the periphery of the upper surface of the SOI integrated circuit portion 8 and connected to it. An insulating film 10 made of, e.g., silicon oxide is formed on the SOI integrated circuit portion 8 and on the upper surfaces of the connecting pads 9 except for their central portions. The central portions of the connecting pads 9 are exposed through holes 11 formed in the insulating film 10.

A protective film 12 made of, e.g., epoxy-based resin or polyimide-based resin is formed on the upper surface of the insulating film 10. Holes 13 are formed in those portions of the protective film 12, which correspond to the holes 11 in the insulating film 10. Metal undercoatings 14 made of, e.g., copper are formed on the upper surface of the protective film 12. An interconnection 15 made of copper is formed on the entire upper surface of each metal undercoating 14. Each interconnection 15 is connected to the connecting pad 9 since one end portion of the metal undercoating 14 is connected to the connecting pad 9 through the both holes 11 and 13.

A columnar electrode (external connection electrode) 16 made of copper is formed on a portion of the upper surface of each interconnection 15, e.g., on an end portion far from the connecting pad 9. A sealing film 17 made of, e.g., epoxy-based resin or polyimide-based resin is formed on the upper surfaces of the interconnections 15 and protective film 12, such that these upper surfaces are leveled with the upper surfaces of the columnar electrodes 16. As described above, the semiconductor constructing body 3 called a W-CSP includes the SOI substrate 5, connecting pads 9, and insulating film 10, and also includes the protective film 12, interconnections 15, columnar electrodes 16, and sealing film 17.

A rectangular or square frame-like insulating layer 21 is formed on the upper surface of the base plate 1 around the semiconductor constructing body 3 including the ground layer 2 so that the upper surface of the insulating layer 21 is substantially leveled with the upper surface of the semiconductor constructing body 3. The insulating layer 21 is made of, e.g., thermosetting resin such as epoxy-based resin or polyimide-based resin, or a material formed by mixing a reinforcing material such as a silica filler in thermosetting resin as described above.

An upper insulating film 22 is formed on the upper surfaces of the semiconductor constructing body 3 and insulating layer 21 so as to have a flat upper surface. The upper insulating film 22 is generally called a buildup material used in a buildup substrate, and formed by mixing a reinforcing material such as a silica filler in thermosetting resin such as epoxy-based resin.

Holes 23 are formed in those portions of the upper insulating film 22, which correspond to the central portions of the upper surfaces of the columnar electrodes 16. Upper metal undercoatings 24 made of, e.g., copper are formed on the upper surface of the upper insulating film 22. An upper interconnection 25 made of copper is formed on the entire upper surface of each upper metal undercoating 24. Each upper interconnection 25 is electrically connected to the columnar electrode 16 since one end portion of the upper metal undercoating 24 is electrically connected to the upper surface of the columnar electrode 16 through the hole 23 in the upper insulating film 22.

An upper overcoat film 26 made of, e.g., solder resist is formed on the upper surfaces of the upper interconnections 25 and upper insulating film 22. Holes 27 are formed in those portions of the upper overcoat film 26, which correspond to connecting pad portions of the upper interconnections 25. A solder ball 28 is formed in and above each hole 27 and electrically connected to the connecting pad portion of the upper interconnection 25. A plurality of solder balls 28 are arranged in a matrix on the upper overcoat film 26.

A vertical through hole 31 is formed in a predetermined portion of the upper insulating film 22, insulating layer 21, ground layer 2, and base plate 1. In the through hole 31, a vertically-extended or vertical conducting portion 32 is electrically connected to the ground layer 2. The vertical conducting portion 32 is made up of a cylindrical metal undercoating 32a made of copper, and a cylindrical copper layer 32b concentrically formed inside the metal undercoating 32a. The upper portion of the vertical conducting portion 32 is electrically connected to one or a plurality of the upper interconnections 25 for grounding.

The lower portion of the vertical conducting portion 32 is electrically connected to a lower metal undercoating 33 and lower interconnection 34 formed into the shape of an island on the lower surface of the base plate 1 around the through hole 31. Since the lower interconnection 34 including the lower metal undercoating 33 has the shape of an island, the lower interconnection 34 is electrically connected to nothing but the vertical conducting portion 32. The vertical conducting portion 32 is filled with a filler 35 made of, e.g., solder resist. A lower overcoat film 36 made of, e.g., solder resist is formed on the lower surface of the base plate 1 including the lower interconnection 34.

The size of the base plate 1 is made somewhat larger than that of the semiconductor constructing body 3 as described above in order to make the formation region of the solder balls 28 somewhat larger than the planar size of the semiconductor constructing body 3 in accordance with an increase of the number of the connecting pads 9 on the SOI substrate 5, thereby making the size and pitch of the connecting pad portions (the portions in the holes 27 of the upper overcoat film 26) of the upper interconnections 25 larger than the size and pitch of the columnar electrodes 16.

Accordingly, the connecting pad portions of the upper interconnections 25 arranged in a matrix are formed not only in the region corresponding to the semiconductor constructing body 3, but also in the region corresponding to the insulating layer 21 formed outside the side surfaces of the semiconductor constructing body 3. That is, of the solder balls 28 arranged in a matrix, at least outermost solder ball or balls 28 are formed in the periphery positioned outside the semiconductor constructing body 3.

In this semiconductor device, the ground layer 2 is formed on the upper surface of the base plate 1 below the semiconductor constructing body 3 having the SOI substrate 5, and the ground layer 2 is connected to the upper interconnection 25 for grounding via the vertical conducting portion 32 formed in the through hole 31 in the upper insulating film 22, insulating layer 21, ground layer 2, and base plate 1. This makes it possible to further downsize the electronic apparatus, and improve the circuit characteristics by minimizing the wiring length.

Figure 2:
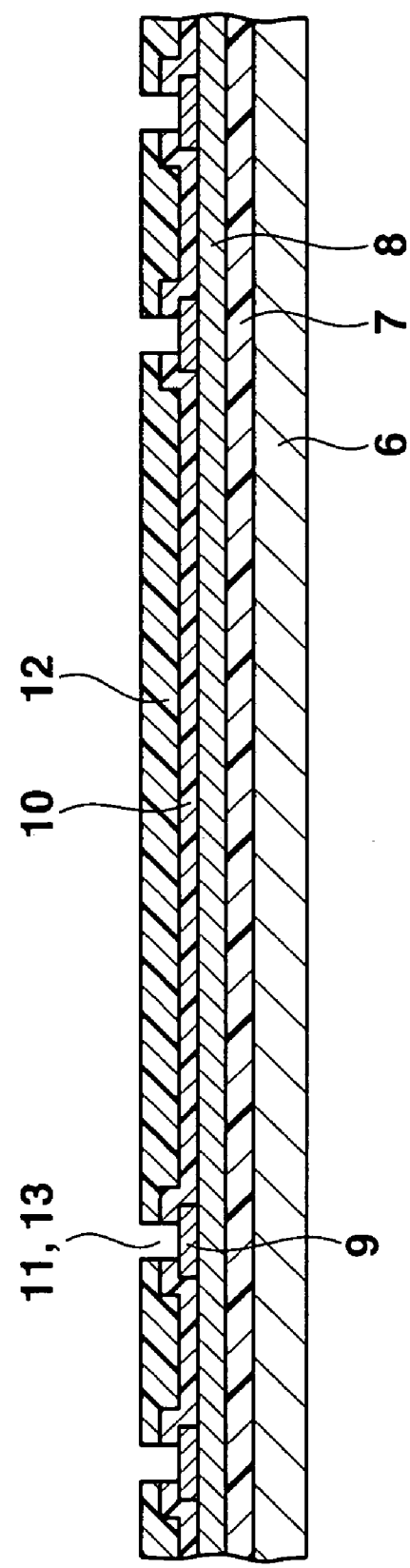
FIG. 2 is a sectional view of an initially prepared assembly in an example of a method of fabricating the semiconductor device shown in FIG. 1.

An example of a method of fabricating this semiconductor device will be explained below. First, an example of the fabrication method of the semiconductor constructing body 3 will be explained. In this method, an assembly as shown in FIG. 2 is first prepared. In this assembly, a silicon oxide film 7, an SOI integrated circuit portion 8 obtained by forming thin-film transistors, connecting pads 9 made of, e.g., an aluminum-based metal, an insulating film 10 made of, e.g., silicon oxide, and a protective film 12 made of, e.g., epoxy-based resin or polyimide-based resin are formed on a wafer-like silicon substrate 6. The central portions of the connecting pads 9 are exposed through holes 11 and 13 formed in the insulating film 10 and protective film 12.

The source and drain regions of the thin-film transistors of the SOI integrated circuit portion 8 are connected to the silicon substrate 6 via vertical conducting portions (not shown) formed in the silicon oxide film 7. Also, the connecting pads 9 are connected to those integrated circuits of the SOI integrated circuit portion 8, which are formed in corresponding regions.

Figure 3:
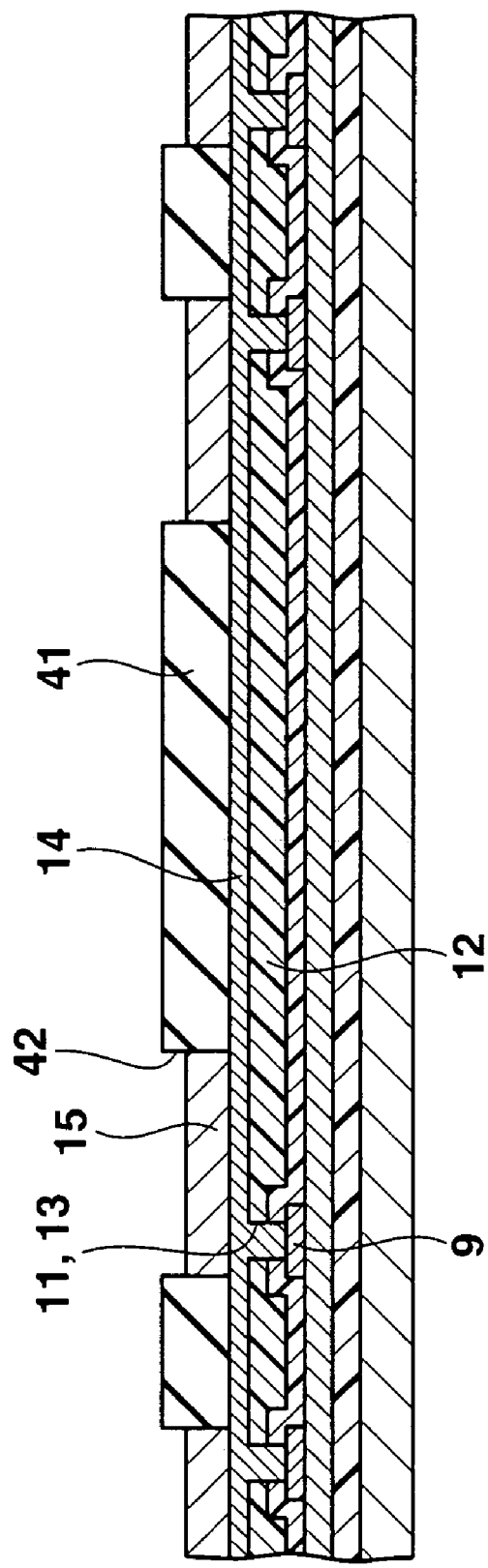
FIG. 3 is a sectional view of a step following FIG. 2.

Then, as shown in FIG. 3, a metal undercoating 14 is formed on the entire upper surface of the protective film 12 including the upper surfaces of the connecting pads 9 exposed through the holes 11 and 13. The metal undercoating 14 can be any of a copper layer formed by electroless plating, a copper layer formed by sputtering, and a combination of a thin film of titanium or the like formed by sputtering and a copper layer formed on this thin film by sputtering.

A plating resist film 41 is formed by patterning on the upper surface of the metal undercoating 14. In this case, holes 42 are formed in those portions of the plating resist film 41, which correspond to regions where interconnections 15 are to be formed. Electroplating of copper is then performed by using the metal undercoating 14 as a plating current path, thereby forming interconnections 15 on the upper surface of the metal undercoating 14 in the holes 42 of the plating resist film 41. After that, the plating resist film 41 is removed.

Figure 4:
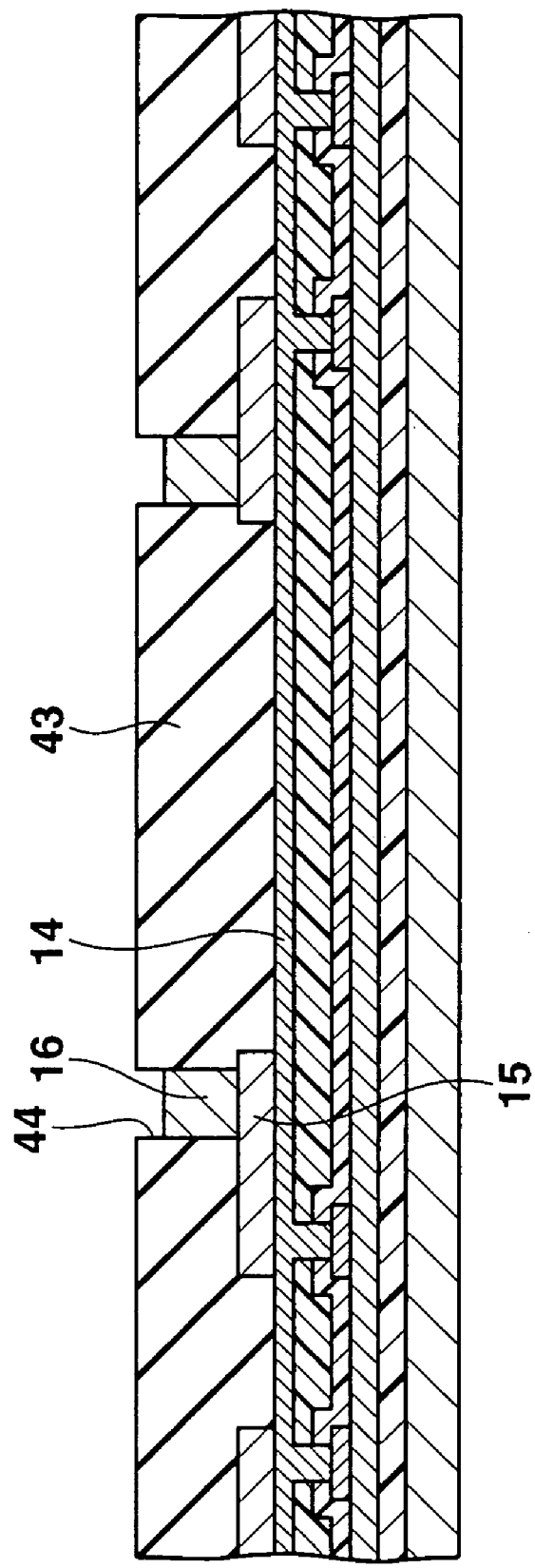
FIG. 4 is a sectional view of a step following FIG. 3.
Figure 5:
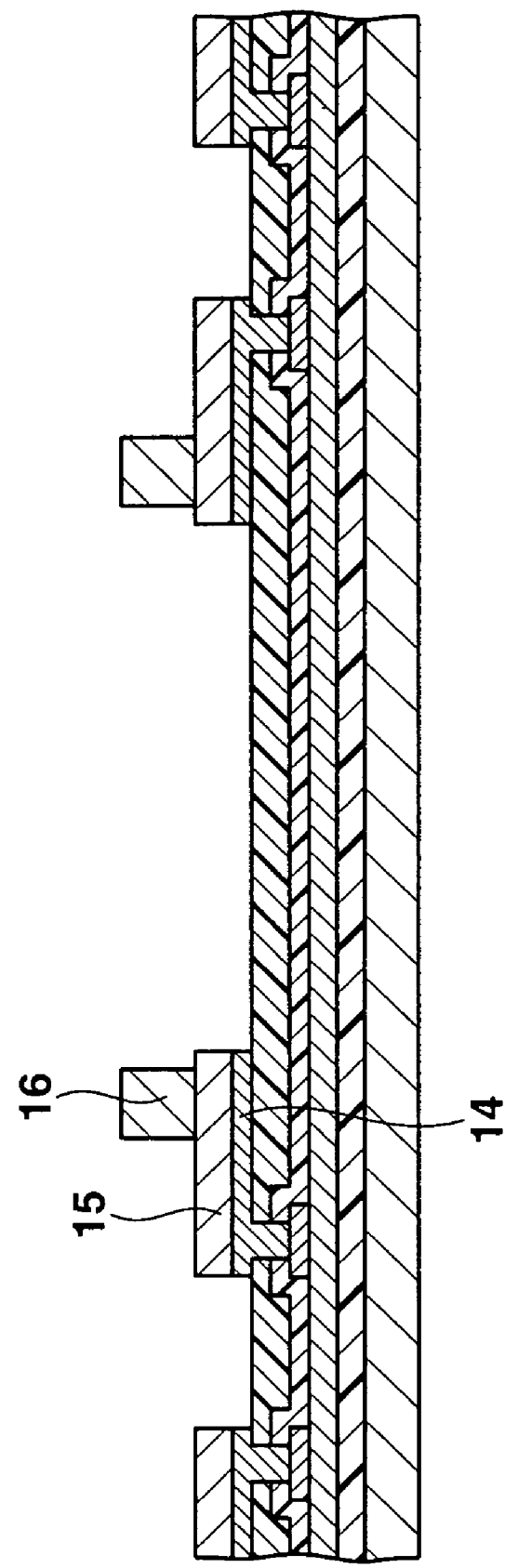
FIG. 5 is a sectional view of a step following FIG. 4.

As shown in FIG. 4, a plating resist film 43 is formed by patterning on the upper surface of the metal undercoating 14 including the interconnections 15. In this case, holes 44 are formed in those portions of the plating resist film 43, which correspond to regions where columnar electrodes 16 are to be formed. Electroplating of copper is then performed by using the metal undercoating 14 as a plating current path, thereby forming columnar electrodes 16 on the upper surfaces of connecting pad portions of the interconnections 15 in the holes 44 of the plating resist film 43. After that, the plating resist film 43 is removed, and unnecessary portions of the metal undercoating 14 are etched away by using the interconnections 15 as masks. Consequently, as shown in FIG. 5, the metal undercoatings 14 remain only below the interconnections 15.

Figure 6:
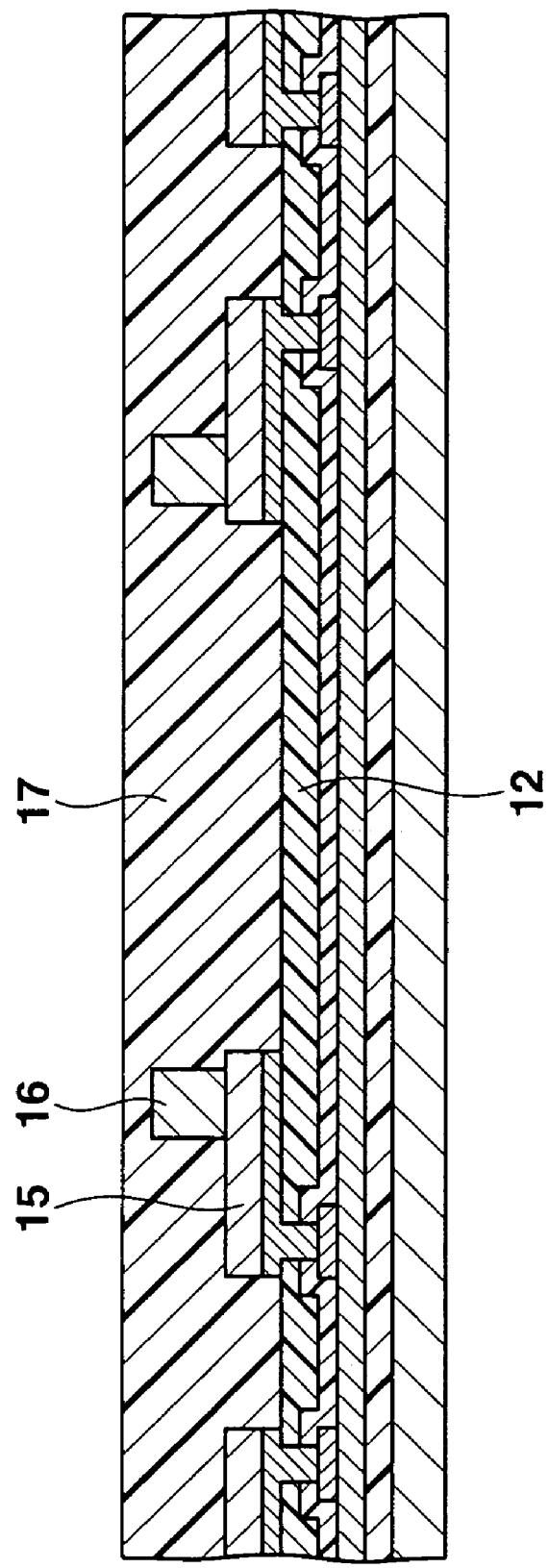
FIG. 6 is a sectional view of a step following FIG. 5.

As shown in FIG. 6, a sealing film 17 made of, e.g., epoxy-based resin or polyimide-based resin is formed on the entire upper surface of the protective film 12 including the columnar electrodes 16 and interconnections 15 by, e.g., screen printing, spin coating, or die coating, such that the thickness of the sealing film 17 is larger than the height of the columnar electrodes 16. In this state, therefore, the upper surfaces of the columnar electrodes 16 are covered with the sealing film 17.

Figure 7:
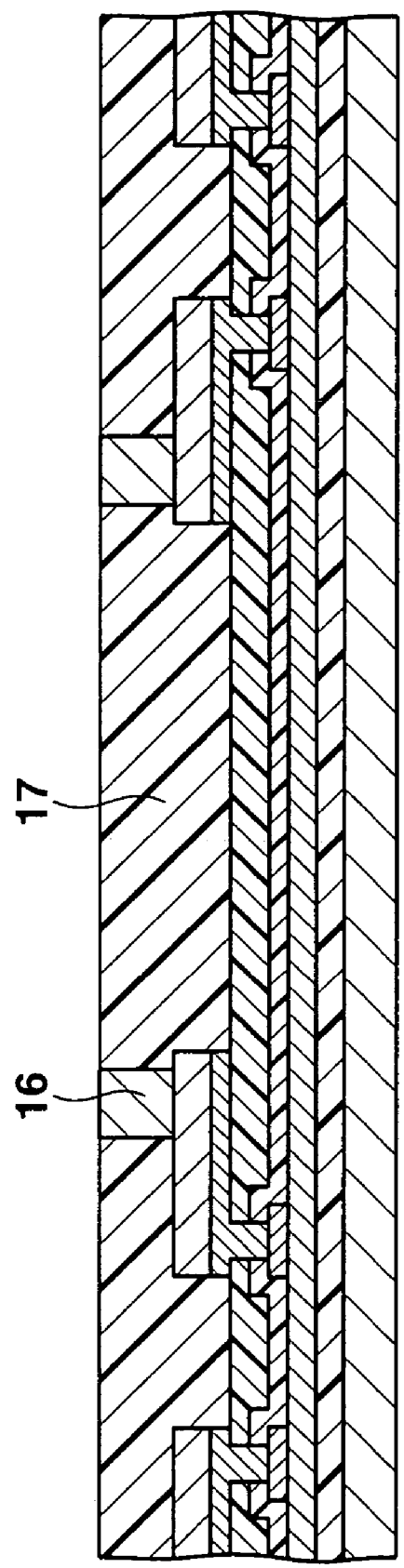
FIG. 7 is a sectional view of a step following FIG. 6.

As shown in FIG. 7, the sealing film 17 and the upper surfaces of the columnar electrodes 16 are properly polished to expose the upper surfaces of the columnar electrodes 16, and planarize the upper surface of the sealing film 17 including those exposed upper surfaces of the columnar electrodes 16. The upper surfaces of the columnar electrodes 16 are thus properly polished in order to make the heights of the columnar electrodes 16 uniform by eliminating variations in height of the columnar electrodes 16 formed by electroplating.

Figure 8:
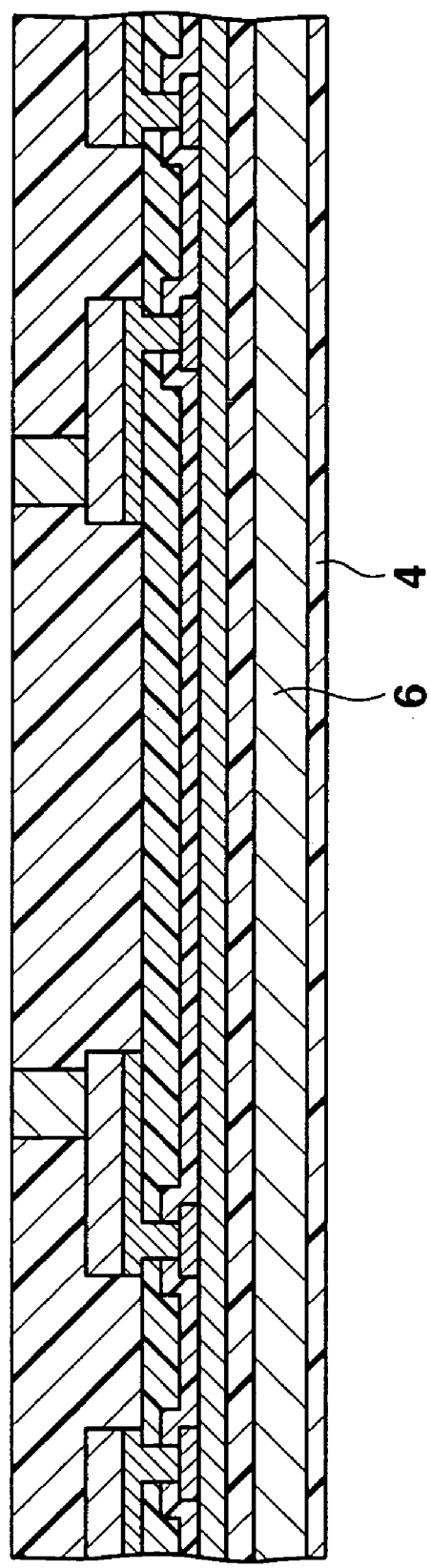
FIG. 8 is a sectional view of a step following FIG. 7.
Figure 9:
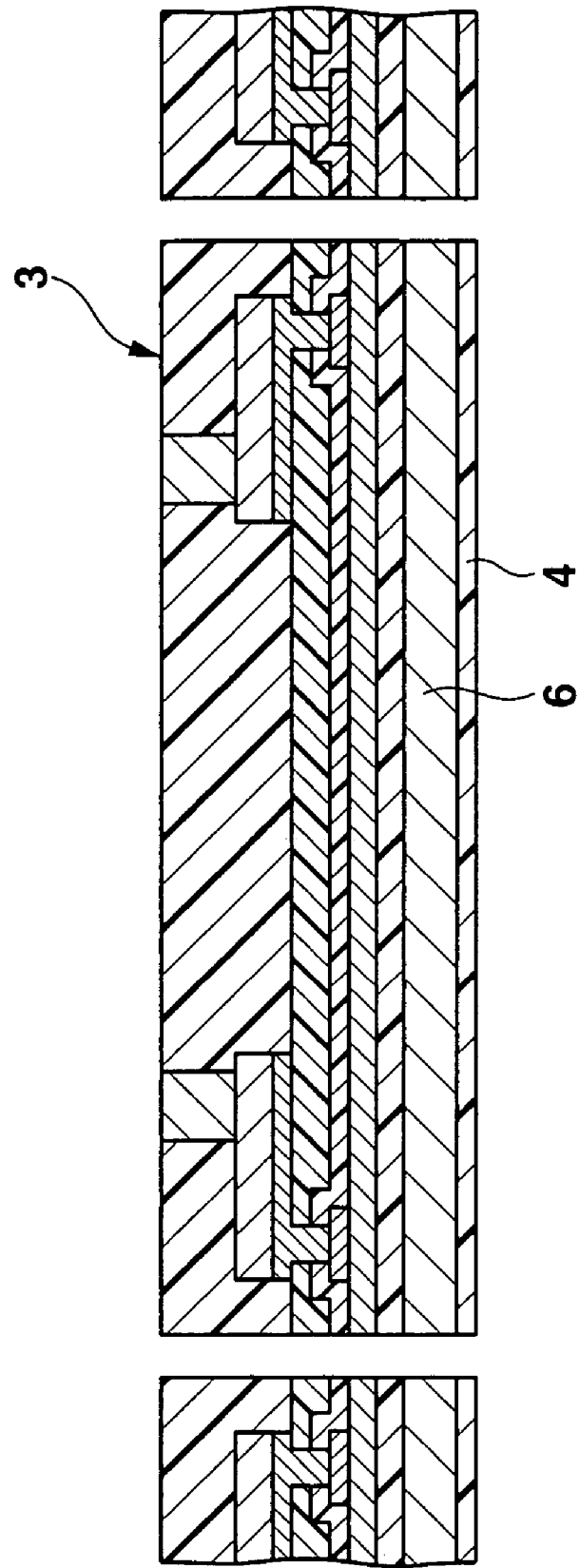
FIG. 9 is a sectional view of a step following FIG. 8.

Then, as shown in FIG. 8, an adhesive layer 4 is adhered to the entire lower surface of the silicon substrate 6. The adhesive layer 4 is made of a die bonding material such as epoxy-based resin or polyimide-based resin, and fixed in a semi-cured state to the silicon substrate 6 by heating and pressing. The adhesive layer 4 fixed to the silicon substrate 6 is adhered to a dicing tape (not shown), and removed from the dicing tape after a dicing step shown in FIG. 9 is performed. Consequently, as shown in FIG. 1, a plurality of semiconductor constructing bodies 3 each having the adhesive layer 4 on the lower surface of the silicon substrate 6 are obtained.

The semiconductor constructing body 3 thus obtained has the adhesive layer 4 on the lower surface of the silicon substrate 6. This obviates the need for a very cumbersome operation of forming an adhesive layer on the lower surface of the silicon substrate 6 of each semiconductor constructing body 3 after the dicing step. Note that the operation of removing the dicing tape after the dicing step is much easier than the operation of forming an adhesive layer on the lower surface of the silicon substrate 6 of each semiconductor constructing body 3 after the dicing step.

Figure 10:
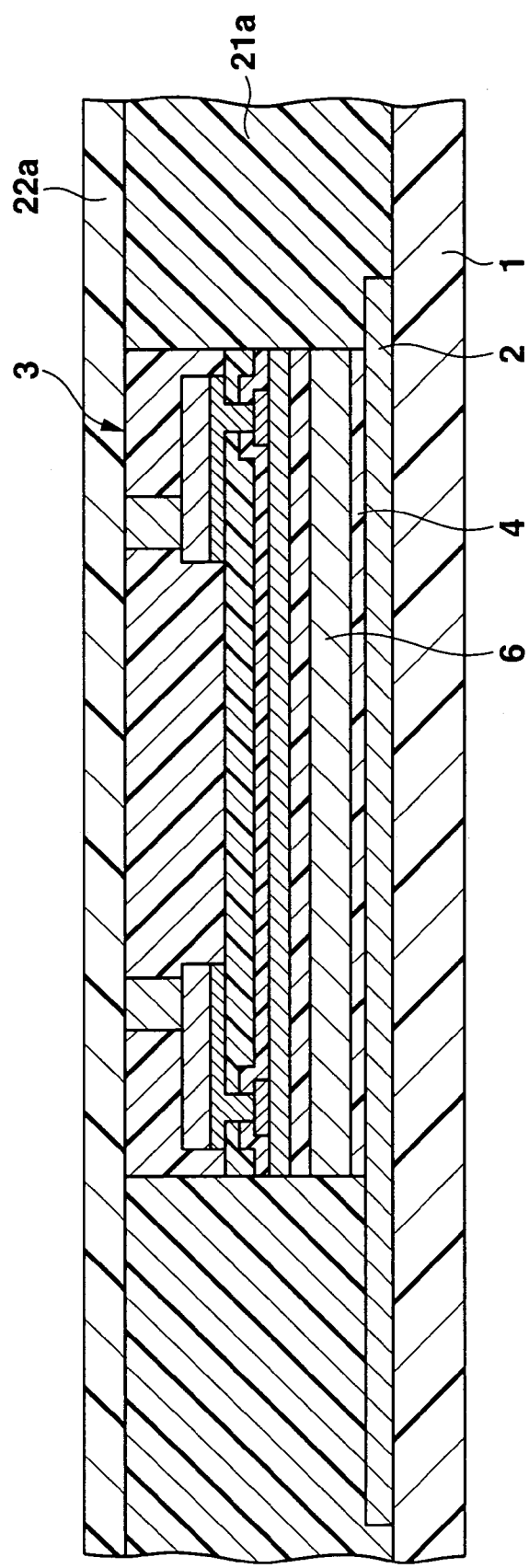
FIG. 10 is a sectional view of a step following FIG. 9.

An example of a method of fabricating the semiconductor device shown in FIG. 1 by using the semiconductor constructing body 3 thus obtained will be described below. First, as shown in FIG. 10, a base plate 1 having a size capable of forming a plurality of completed semiconductor devices shown in FIG. 1 is prepared. The base plate 1 has, e.g., a square planar shape, although the shape is not particularly limited. A ground layer 2 having a solid pattern is formed on the upper surface of the base plate 1 by patterning copper foil, which is laminated on the upper surface of the base plate 1, by photolithography.

Then, the adhesive layers 4 adhered to the lower surfaces of the silicon substrates 6 of the semiconductor constructing bodies 3 are adhered to a plurality of predetermined portions on the upper surface of the ground layer 2. In this adhesion, the adhesive layers 4 are finally cured by heating and pressing. An insulating layer formation layer 21a is formed on the upper surface of the base plate 1 including the ground layer 2 around the semiconductor constructing body 3 by, e.g., screen printing or spin coating. The insulating layer formation layer 21a is made of, e.g., thermosetting resin such as epoxy-based resin or polyimide-based resin, or a material obtained by mixing a reinforcing material such as a silica filler in thermosetting resin like this.

Subsequently, an upper insulating film formation sheet 22a is placed on the upper surfaces of the semiconductor constructing body 3 and insulating layer formation layer 21a. The upper insulating film formation sheet 22a is preferably made of a sheet-like buildup material, although the material is not particularly limited. This buildup material is obtained by mixing a silica filler in thermosetting resin such as epoxy-based resin, and semi-curing the thermosetting resin. Note that it is also possible to use, as the upper insulating film formation sheet 22a, a prepreg material obtained by impregnating glass fabric with thermosetting resin such as epoxy-based resin, and semi-curing the thermosetting resin into the form of a sheet, or a sheet made only of semi-cured thermosetting resin in which no silica filler is mixed.

Figure 11:
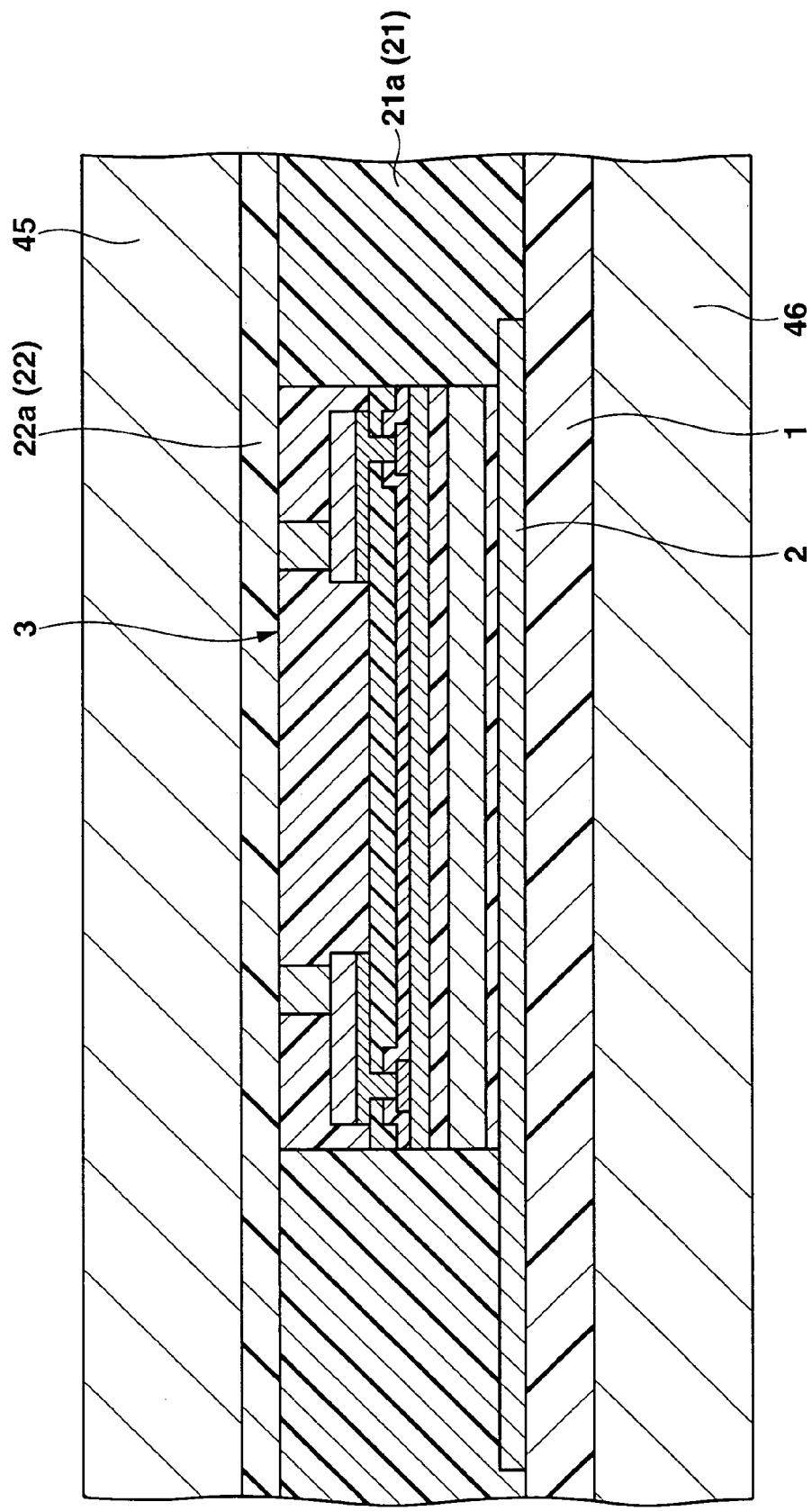
FIG. 11 is a sectional view of a step following FIG. 10.

As shown in FIG. 11, a pair of heating/pressing plates 45 and 46 are used to heat and press the insulating layer formation layer 21a and upper insulating film formation sheet 22a from above and below. Consequently, an insulating layer 21 is formed on the upper surface of the base plate 1 including the ground layer 2 around the semiconductor constructing body 3, and an upper insulating film 22 is formed on the upper surfaces of the semiconductor constructing body 3 and insulating layer 21. In this case, the upper surface of the upper insulating film 22 is a flat surface because it is pressed by the lower surface of the upper heating/pressing plate 45. Accordingly, no polishing step of planarizing the upper surface of the upper insulting film 22 is necessary.

Figure 12:
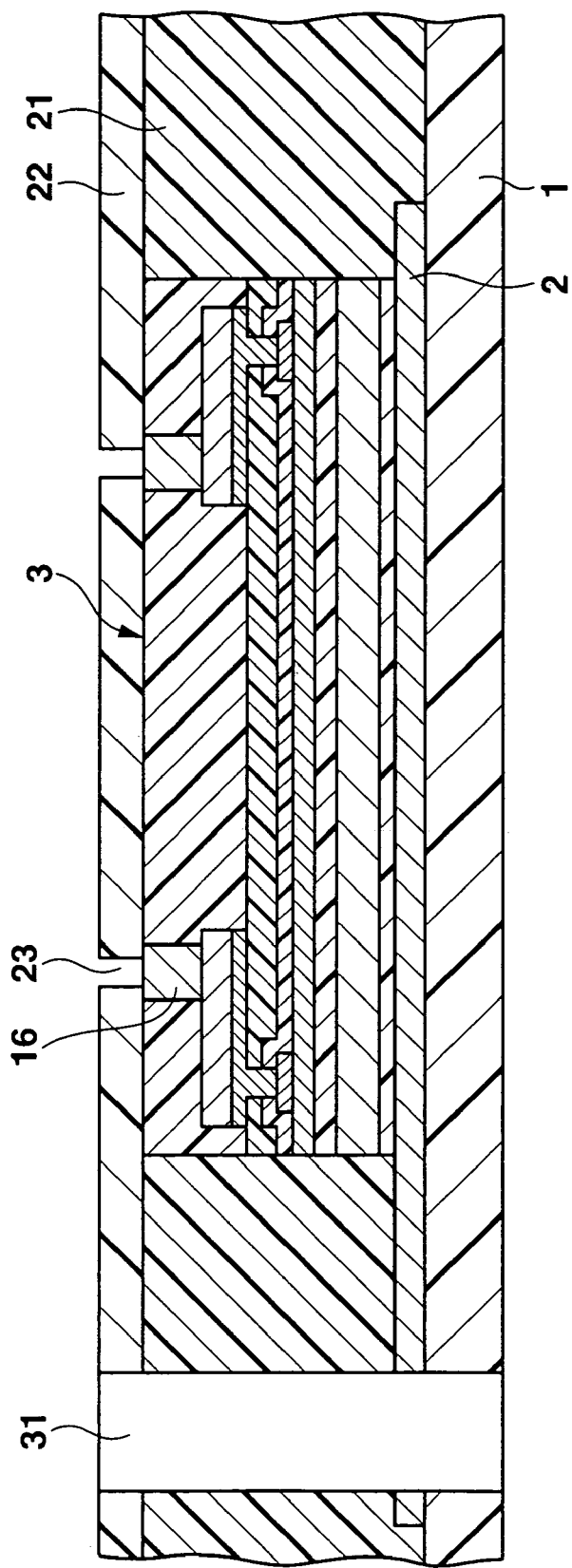
FIG. 12 is a sectional view of a step following FIG. 11.

As shown in FIG. 12, laser processing which radiates a laser beam is used to form holes 23 in those portions of the upper insulating film 22, which correspond to the central portions of the upper surfaces of the columnar electrodes 16. Also, a mechanical drill is used to form a through hole 31 in a predetermined portion of the upper insulating film 22, insulating layer 21, ground layer 2, and base plate 1. Then, if necessary, epoxy smear and the like occurring in the holes 23, through hole 31, and the like are removed by a desmear process.

Figure 13:
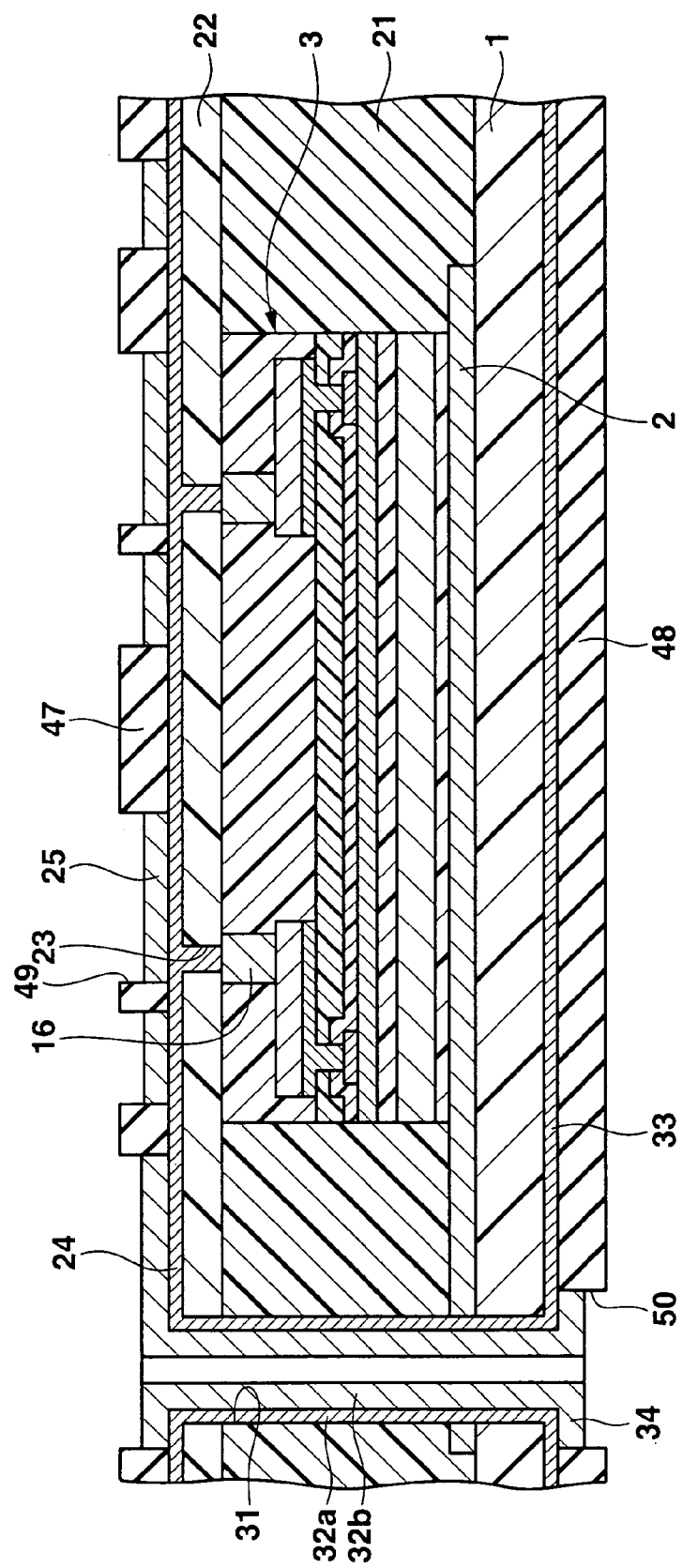
FIG. 13 is a sectional view of a step following FIG. 12.

As shown in FIG. 13, an upper metal undercoating 24, lower metal undercoating 33, and metal undercoating 32a are formed by electroless plating of copper on the entire upper surface of the upper insulating film 22 including the upper surfaces of the columnar electrodes 16 exposed through the holes 23, on the entire lower surface of the base plate 1, and on the inner wall surfaces of the through hole 31. Then, an upper plating resist film 47 is formed by patterning on the upper surface of the upper metal undercoating 24, and a lower plating resist film 48 is formed by patterning on the lower surface of the lower metal undercoating 33. In this case, holes 49 are formed in those portions of the upper plating resist film 47, which correspond to formation regions of upper interconnections 25. Also, a hole 50 is formed in that portion of the lower plating resist film 48, which corresponds to a formation region, including the through hole 31, of a lower interconnection 34.

Electroplating of copper is then performed by using the metal undercoatings 24, 33, and 32a as plating current paths, thereby forming upper interconnections 25 on the upper surface of the upper metal undercoating 24 in the holes 49 of the upper plating resist film 47. Also, a lower interconnection 34 is formed on the lower surface of the lower metal undercoating 33 in the hole 50 of the lower plating resist film 48, and a copper layer 32b is formed on the surface of the metal undercoating 32a in the through hole 31.

Figure 14:
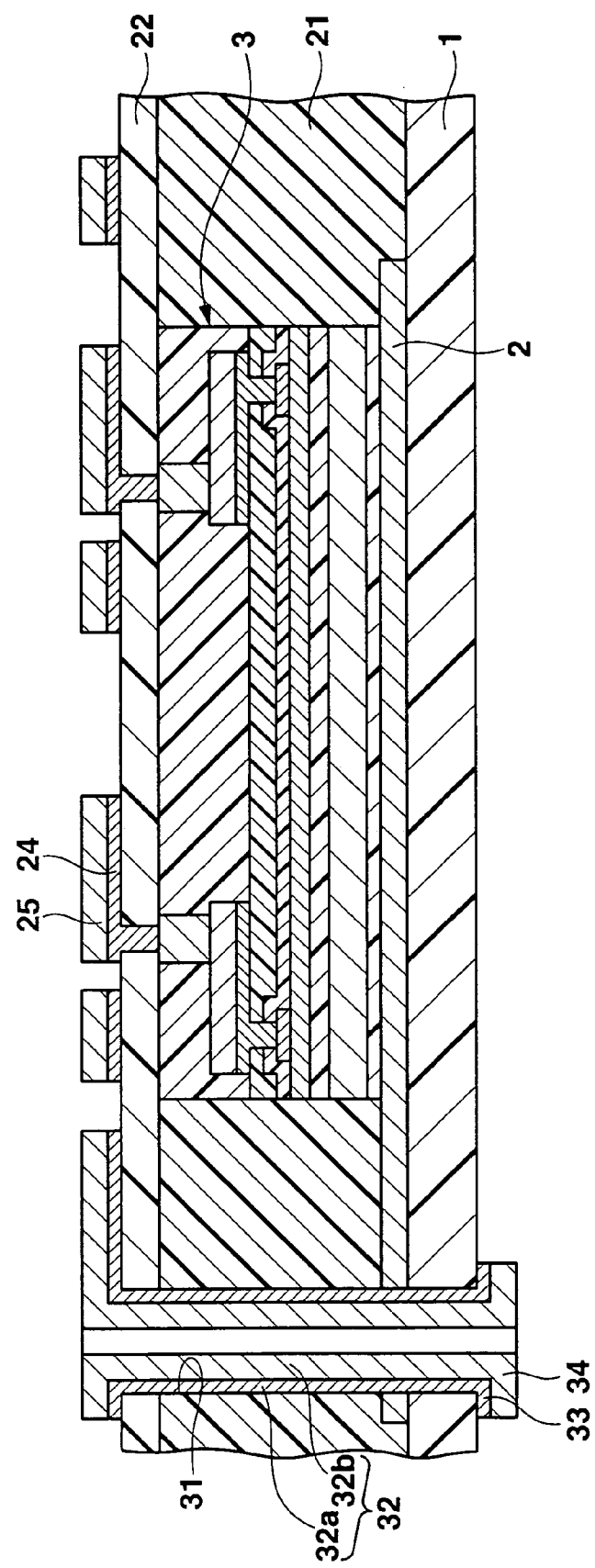
FIG. 14 is a sectional view of a step following FIG. 13.

After that, the two plating resist films 47 and 48 are removed, and unnecessary portions of the metal undercoatings 24 and 33 are etched away by using the upper interconnections 25 and lower interconnections 34 as masks. Consequently, as shown in FIG. 14, the upper metal undercoatings 24 remain only below the upper interconnections 25. Also, the lower metal undercoating 33 remains only below the lower interconnection 34. In this state, a vertical conducting portion 32 made up of the metal undercoating 32a and copper layer 32b is formed on the inner wall surfaces of the through hole 31, and connected to the ground layer 2.

Figure 15:
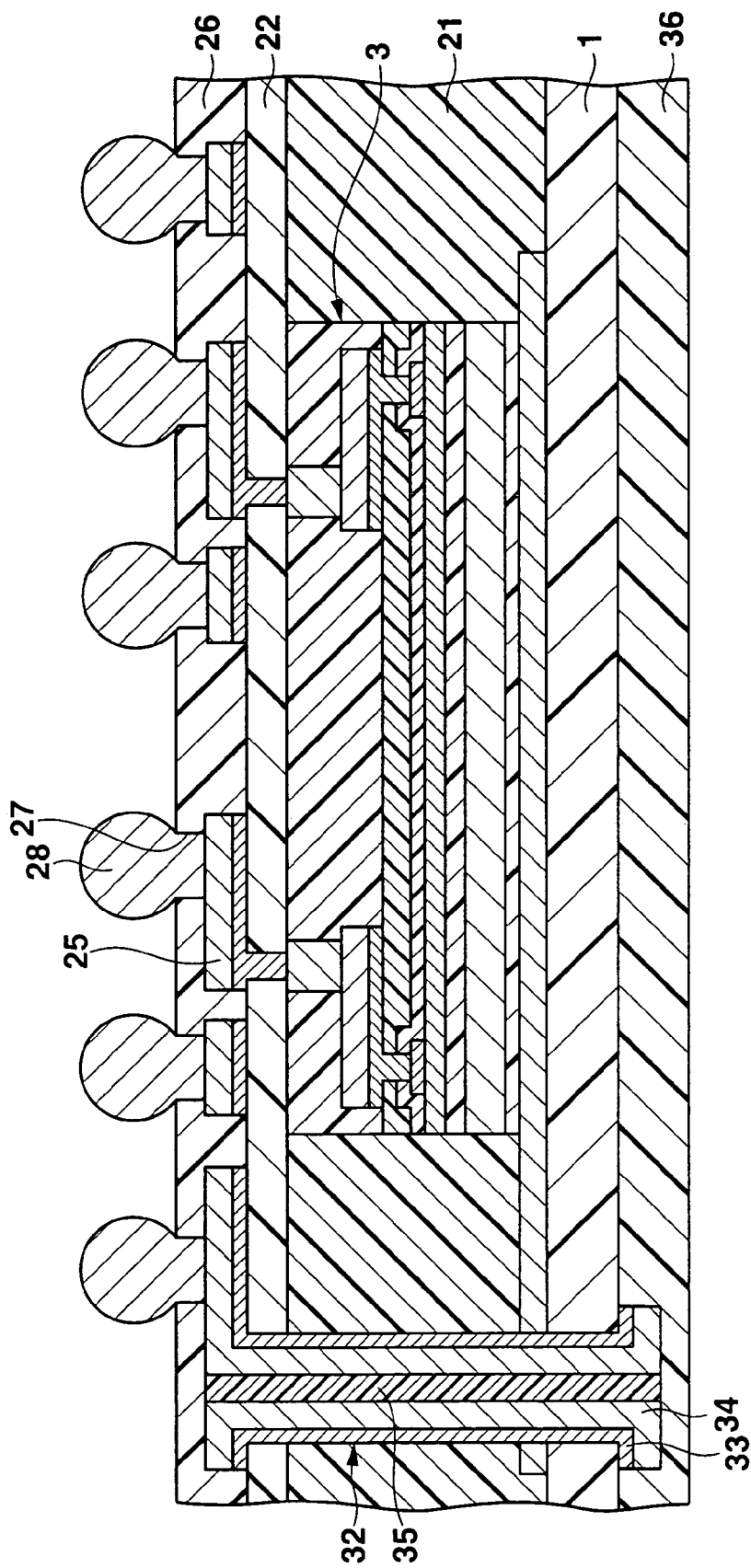
FIG. 15 is a sectional view of a step following FIG. 14.

Then, as shown in FIG. 15, screen printing, spin coating, or the like is performed to form an upper overcoat film 26 made of, e.g., solder resist on the upper surface of the upper insulating film 22 including the upper interconnections 25, and form a lower overcoat film 36 made of, e.g., solder resist on the lower surface of the base plate 1 including the lower interconnection 34. At the same time, a filler 35 made of, e.g., solder resist is filled in the vertical conducting portion 32. In this case, holes 27 are formed in those portions of the upper overcoat film 26, which correspond to connecting pad portions of the upper interconnections 25.

Solder balls 28 are then formed in and above the holes 27 and connected to the connecting pad portions of the upper interconnections 25. After that, the upper overcoat film 26, upper insulating film 22, insulating layer 21, base plate 1, and lower overcoat film 36 are cut between the semiconductor constructing bodies 3 adjacent to each other, thereby obtaining a plurality of semiconductor devices shown in FIG. 1.

In this fabrication method as described above, a plurality of semiconductor constructing bodies 3 are arranged on the base plate 1 via the adhesive layers 4, and, particularly, the upper interconnections 25, vertical conducting portions 32, and solder balls 28 are collectively formed for the semiconductor constructing bodies 3. After that, a plurality of semiconductor devices are obtained by cutting. Therefore, the fabrication process can be simplified. Also, a plurality of semiconductor constructing bodies 3 can be transferred together with the base plate 1 from the fabrication step shown in FIG. 11. This also simplifies the fabrication process.

SECOND EMBODIMENT

Figure 16:
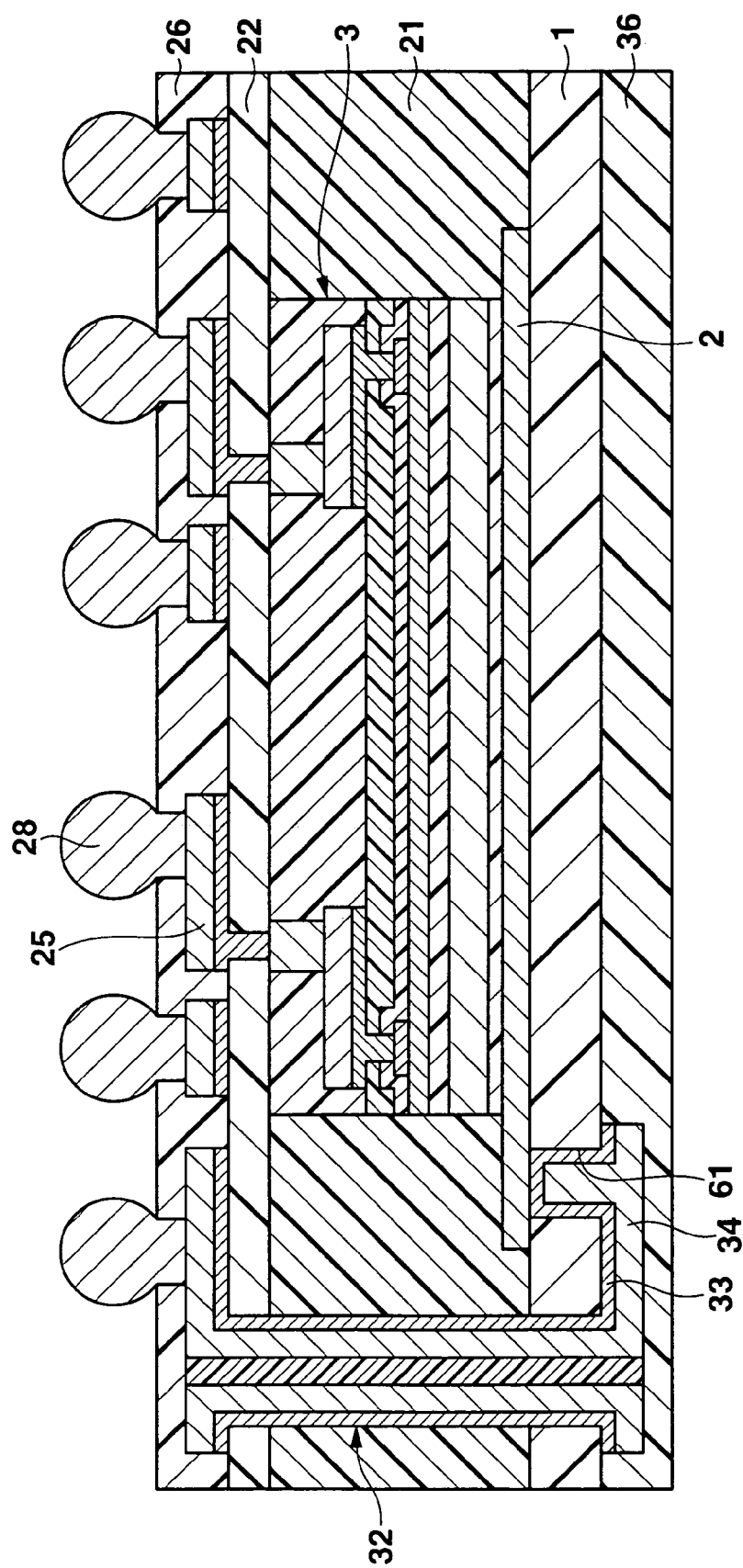
FIG. 16 is a sectional view of a semiconductor device as the second embodiment of the present invention.

FIG. 16 is a sectional view of a semiconductor device as the second embodiment of the present invention. This semiconductor device differs from the semiconductor device shown in FIG. 1 in that a ground layer 2 is not directly connected to a vertical conducting portion 32, and a lower interconnection 34 including a lower metal undercoating 33 formed on the lower surface of a base plate 1 and connected to the vertical conducting portion 32 is connected to the lower surface of the ground layer 2 via a through hole 61 formed in the base plate 1. In this structure, the through hole 61 is formed in the base plate 1 made of, e.g., glass-fiber-base epoxy resin by laser processing which radiates a laser beam.

THIRD EMBODIMENT

Figure 17:
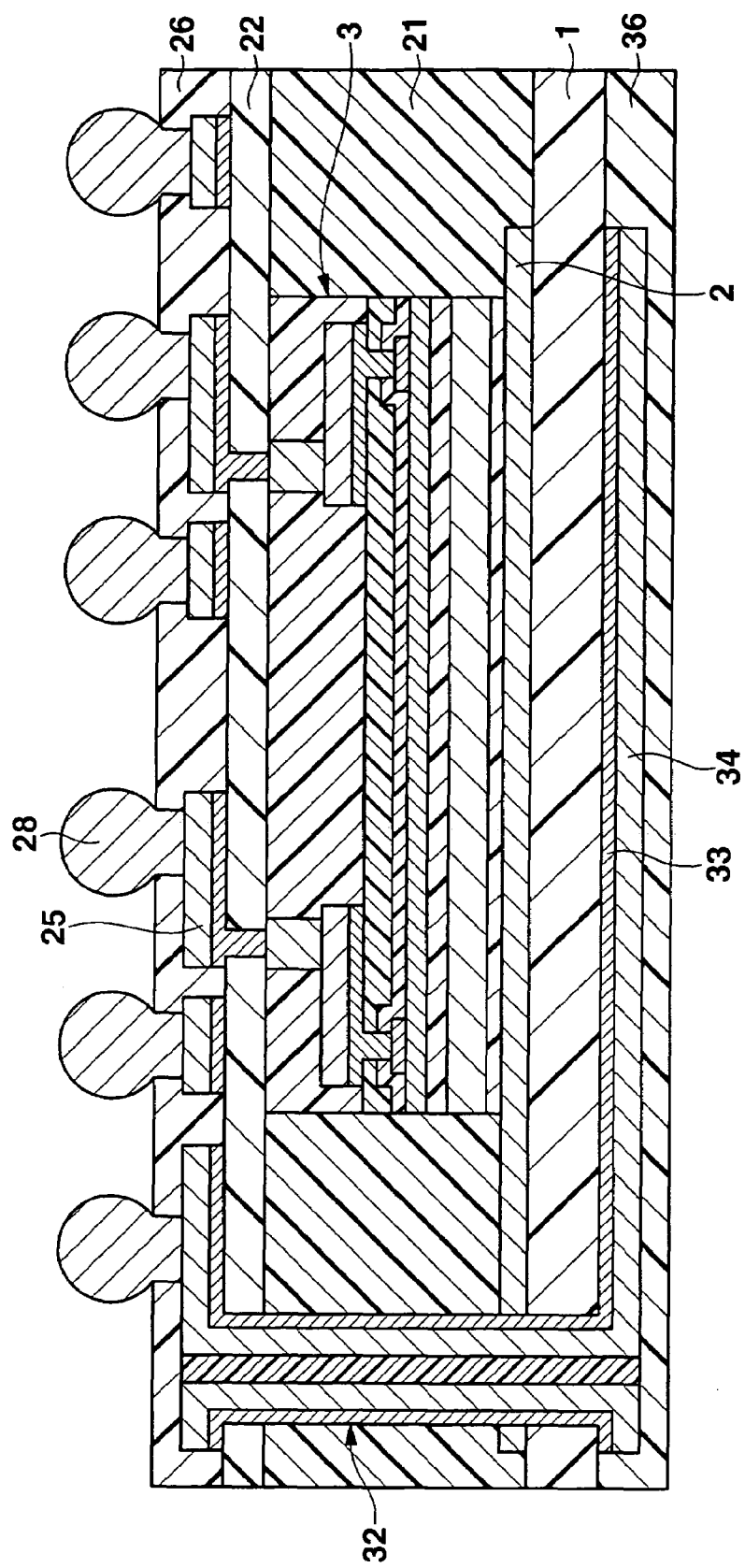
FIG. 17 is a sectional view of a semiconductor device as the third embodiment of the present invention.

FIG. 17 is a sectional view of a semiconductor device as the third embodiment of the present invention. This semiconductor device differs from the semiconductor device shown in FIG. 1 in that a ground layer 2 is formed on the upper surface of a base plate 1, a lower interconnection 34 including a lower metal undercoating 33 is formed as a solid pattern on the lower surface of the base plate 1, and the lower interconnection 34 having this solid pattern is given the function of a ground layer.

FOURTH EMBODIMENT

Figure 18:
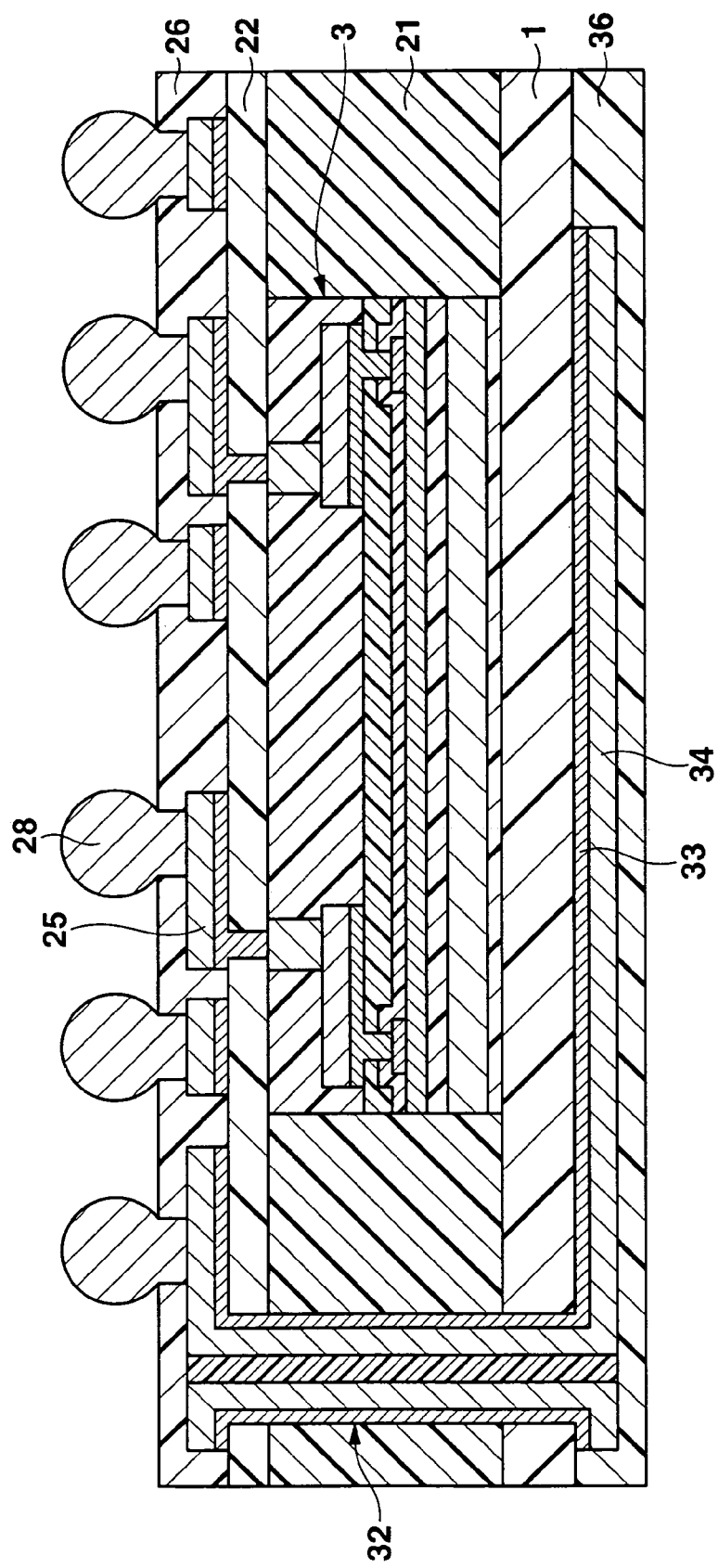
FIG. 18 is a sectional view of a semiconductor device as the fourth embodiment of the present invention.

FIG. 18 is a sectional view of a semiconductor device as the fourth embodiment of the present invention. This semiconductor device differs from the semiconductor device shown in FIG. 1 in that a ground layer 2 is not formed on the upper surface of a base plate 1, a lower interconnection 34 including a lower metal undercoating 33 is formed as a solid pattern on the lower surface of the base plate 1, and the lower interconnection 34 having this solid pattern is given the function of a ground layer.

FIFTH EMBODIMENT

Figure 19:
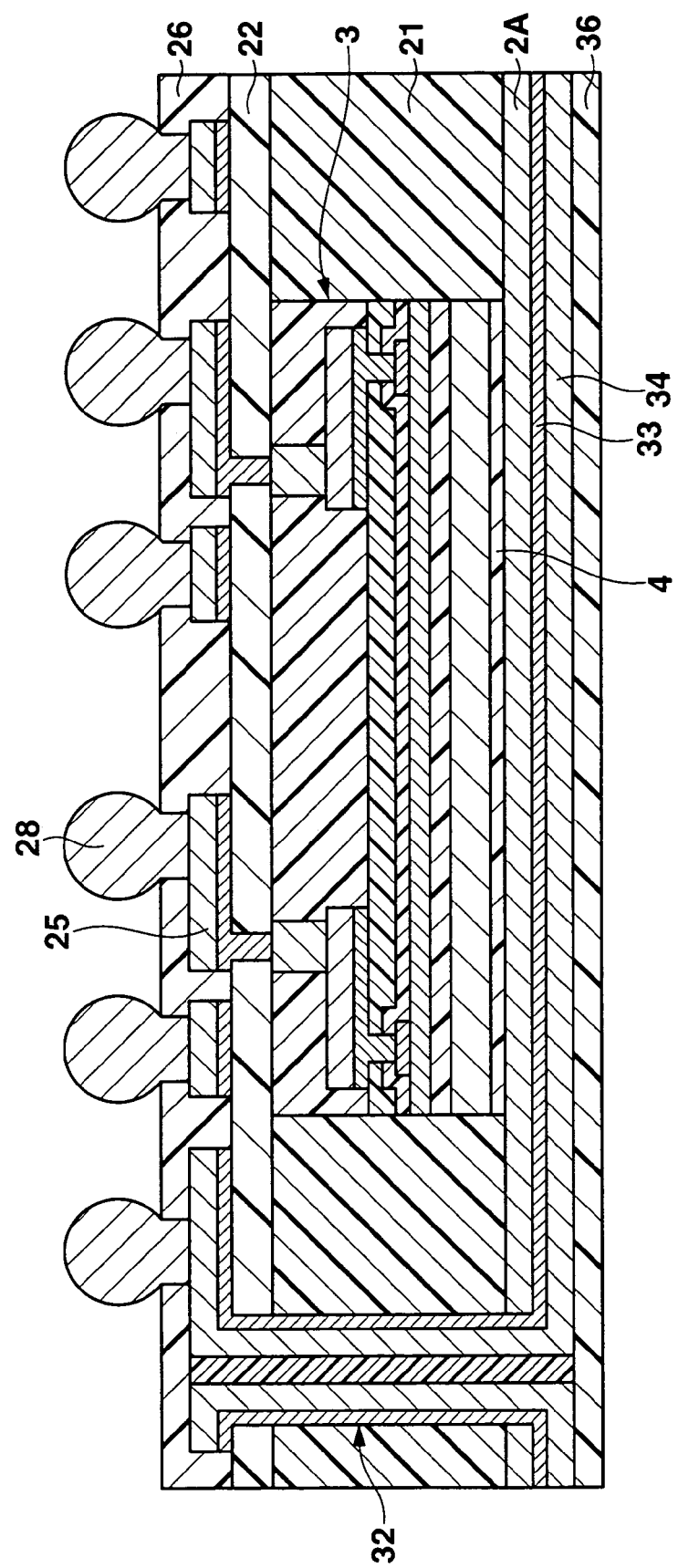
FIG. 19 is a sectional view of a semiconductor device as the fifth embodiment of the present invention.

FIG. 19 is a sectional view of a semiconductor device as the fifth embodiment of the present invention. This semiconductor device differs from the semiconductor device shown in FIG. 1 in that a base plate 1 made of an insulating material such as glass-fabric-base epoxy resin is not formed, a semiconductor constructing body 3 and insulating layer 21 are formed on the upper surface of metal foil (a base member) 2A made of, e.g., copper foil, a lower interconnection 34 including a lower metal undercoating 33 is formed on the entire lower surface of the metal foil 2A, and a lower overcoat film 36 is formed on the entire lower surface of the lower interconnection 34. In this structure, the metal foil 2A including the lower interconnection 34 has the function of a ground layer.

Figure 20:
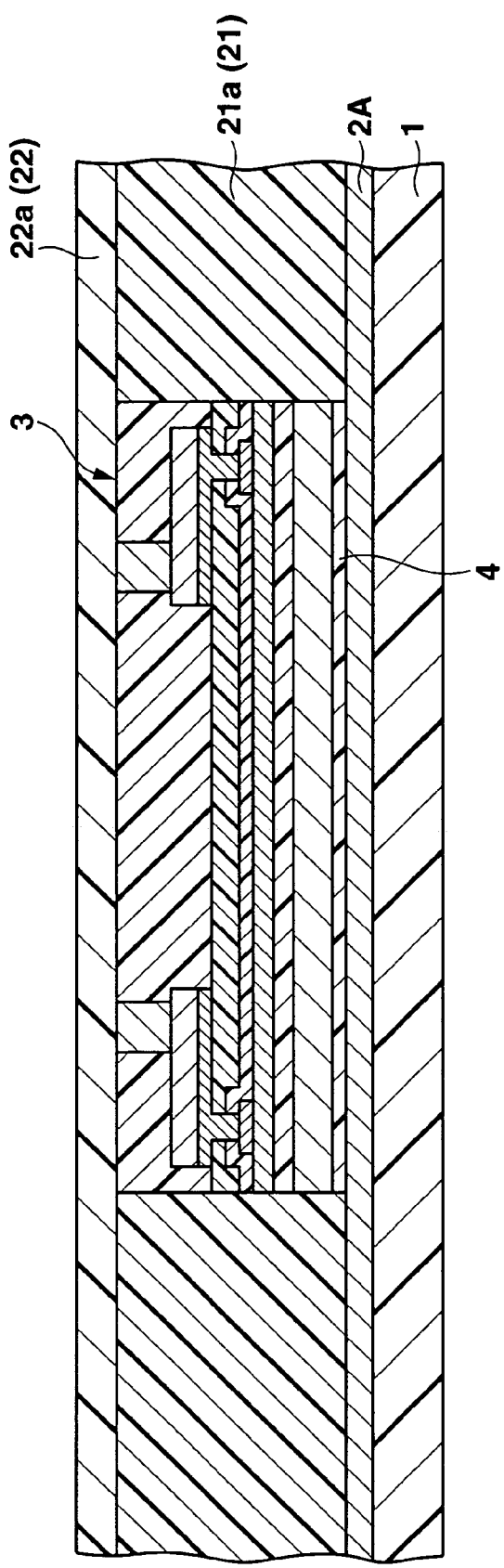
FIG. 20 is a sectional view of a predetermined step in the fabrication of the semiconductor device shown in FIG. 19.

This semiconductor device is fabricated as follows. In the step shown in FIG. 10, as shown in FIG. 20, the lower surface of a semiconductor constructing body 3 is adhered via an adhesive layer 4 to the upper surface of metal foil 2A such as copper foil laminated on the upper surface of a base plate 1 made of, e.g., glass-fabric-base epoxy resin or aluminum. Then, an insulating layer formation layer 21a is formed on the upper surface of the metal foil 2A around the semiconductor constructing body 3 by, e.g., screen printing or spin coating. An upper insulating film formation sheet 22a is placed on the upper surfaces of the semiconductor constructing body 3 and insulating layer formation layer 21a.

Figure 21:
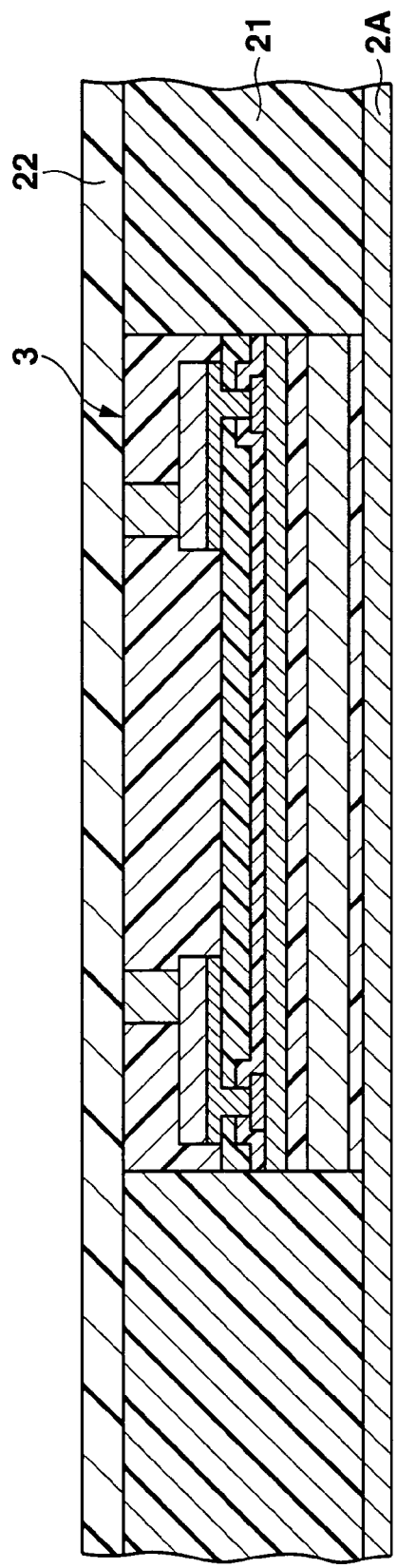
FIG. 21 is a sectional view of a step following FIG. 20.

Subsequently, a pair of heating/pressing plates (not shown) are used to heat and press the insulating layer formation layer 21a and upper insulating film formation sheet 22a from above and below. Consequently, an insulating layer 21 is formed on the upper surface of the metal foil 2A around the semiconductor constructing body 3, and an upper insulating film 22 is formed on the upper surfaces of the semiconductor constructing body 3 and insulating layer 21. When the base plate 1 is peeled from the metal foil 2A after that, the metal foil 2A is exposed as shown in FIG. 21.

In this state, the semiconductor constructing body 3 and insulating layer 21 are formed on the metal foil 2A such as copper foil, and the upper insulating film 22 is formed on the semiconductor constructing body 3 and insulating layer 21. Therefore, even if the metal foil 2A such as copper foil is limp, no strength problem arises. The subsequent steps are substantially the same as in the first embodiment, so an explanation thereof will be omitted. This semiconductor device shown in FIG. 19 has no base plate 1, so the thickness of the device can be decreased accordingly.

SIXTH EMBODIMENT

Figure 22:
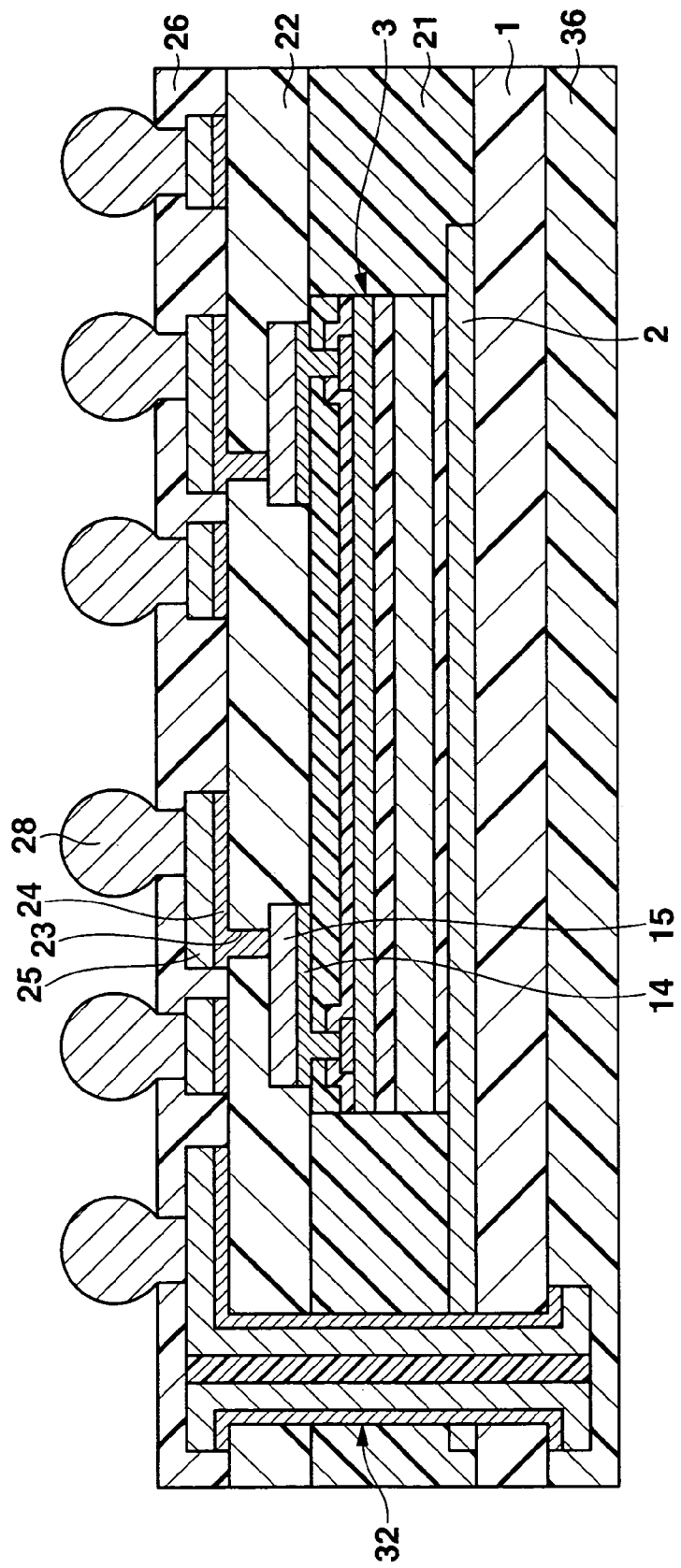
FIG. 22 is a sectional view of a semiconductor device as the sixth embodiment of the present invention.

FIG. 22 is a sectional view of a semiconductor device as the sixth embodiment of the present invention. This semiconductor device differs from the semiconductor device shown in FIG. 1 in that a semiconductor constructing body 3 has a structure in which interconnections 15 including metal undercoatings 14 are exposed without forming any columnar electrodes 16 and sealing film 17, and one end portion of each upper interconnection 25 including an upper metal undercoating 24 is connected to a connecting pad (external connection electrode) of the interconnection 15 through a hole 23 formed in an upper insulating film 22.

Figure 23:
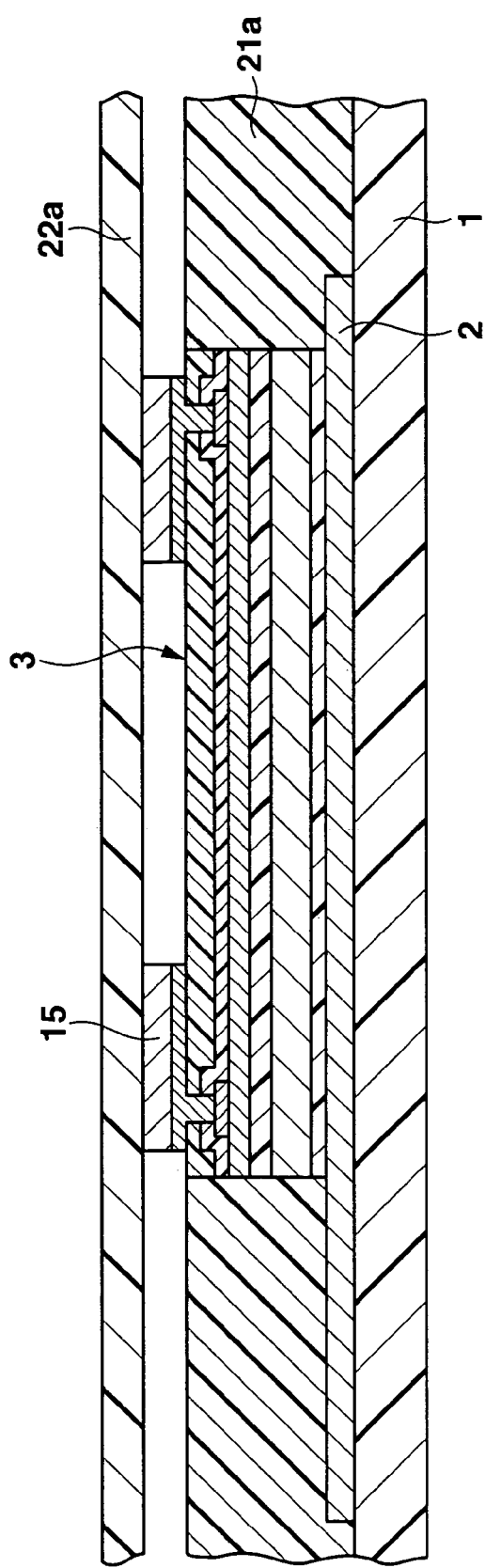
FIG. 23 is a sectional view of a predetermined step in the fabrication of the semiconductor device shown in FIG. 22.

This semiconductor device is fabricated as follows. In the step shown in FIG. 10, as shown in FIG. 23, an insulating layer formation layer 21a is formed on the upper surface of a base plate 1 including a ground layer 2 around a semiconductor constructing body 3 by, e.g., screen printing or spin coating. An upper insulating film formation sheet 22a is then placed on the upper surfaces of the interconnections 15 of the semiconductor constructing body 3. In this state, a pair of heating/pressing plates (not shown) are used to heat and press the insulating layer formation layer 21a and upper insulating film formation sheet 22a from above and below.

SEVENTH EMBODIMENT

Figure 24:
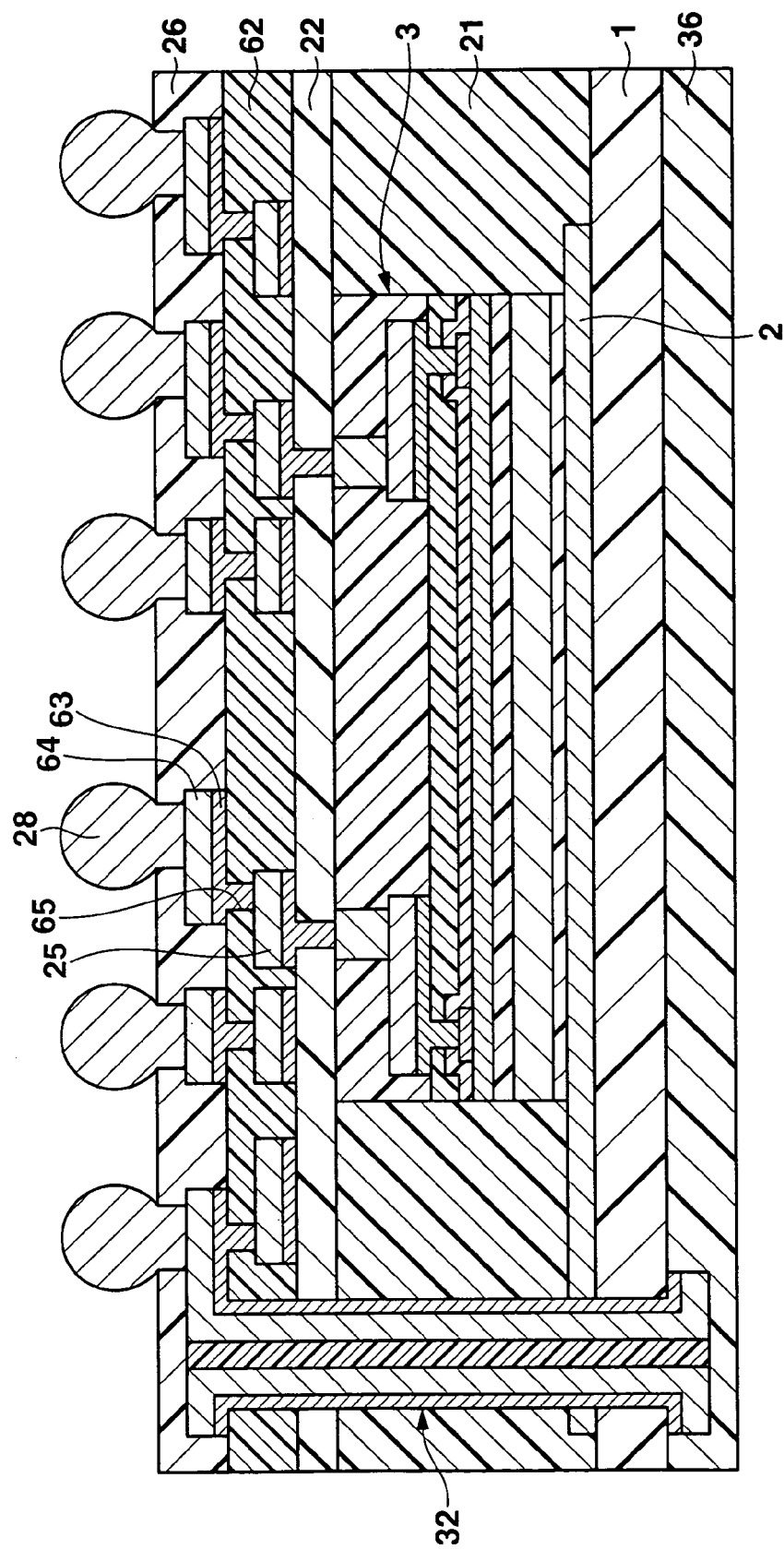
FIG. 24 is a sectional view of a semiconductor device as the seventh embodiment of the present invention.

In the first embodiment, as shown in FIG. 1, only one upper interconnecting layer 25 is formed on the upper insulating film 22. However, two or more layers may also be formed. For example, two layers may also be formed as in the seventh embodiment of the present invention shown in FIG. 24. That is, a second upper insulating film 62 is formed between an upper insulating film 22 and upper overcoat film 26. One end portion of each second upper interconnection 64 including a second upper metal undercoating 63 formed on the upper surface of the second upper insulating film 62 is connected to a connecting pad portion of an upper interconnection 25 through a hole 65 formed in the second upper insulting film 62. Solder balls 28 are formed on the connecting pad portions of the second upper interconnections 64. In this structure, a ground layer 2 is connected to the second upper interconnection 64 via a vertical conducting portion 32.

OTHER EMBODIMENTS

In the first embodiment, the semiconductor wafer is cut between the semiconductor constructing bodies 3 adjacent to each other. However, two or more semiconductor constructing bodies 3 may also be separated together as one set to obtain a multi-chip module type semiconductor device. In this case, the types of two semiconductor constructing bodies 3 forming one set can be either the same or different.

Also, in the first embodiment, the semiconductor constructing body 3 has the SOI substrate 5 as shown in FIG. 1. However, the semiconductor constructing body 3 may also have a normal bare chip having a structure in which an integrated circuit having a predetermined function is formed on the upper surface of a silicon substrate, and a plurality of connecting pads are formed in the periphery of the upper surface of the silicon substrate and connected to the integrated circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
at least one semiconductor constructing body which comprises: (i) an SOI semiconductor substrate including a semiconductor substrate, an insulating layer formed on the semiconductor substrate, and an SOI integrated circuit portion which is provided on the insulating layer and which includes a number of thin-film transistors, and (ii) a plurality of external connection electrodes connected to the SOI integrated circuit portion;
a metal foil which is electrically connected to the semiconductor substrate and to which a ground potential is applied;

an insulating layer provided around the semiconductor constructing body and having a thickness substantially equal to a thickness of the semiconductor constructing body;

at least one upper interconnecting layer which is provided on the semiconductor constructing body and the insulating layer, and which is electrically connected to at least one of the external connection electrodes of the semiconductor constructing body; and a vertical conducting portion which extends through at least the insulating layer and electrically connects the metal foil to the upper interconnecting layer.

2. A device according to claim 1, wherein the metal foil has an outer size which is substantially equal to an outer size of the insulating layer.

3. A device according to claim 2, wherein the metal foil has a through hole through which the vertical conducting portion extends.

4. A device according to claim 1, further comprising a base plate which supports the metal foil.

5. A device according to claim 1, wherein the semiconductor constructing body is fixed to the metal foil by an adhesive which is electrically connected to the metal foil.

6. A device according to claim 1, further comprising an upper insulating layer which covers the semiconductor constructing body and the insulating layer, wherein the upper interconnecting layer is formed on the upper insulating layer.

7. A device according to claim 1, wherein the external connection electrodes of the semiconductor constructing body have a columnar shape.

8. A device according to claim 7, wherein the semiconductor constructing body includes a sealing film formed between the columnar electrodes on the semiconductor substrate.

* * * * *